(12) United States Patent
Motz

(10) Patent No.: US 11,598,824 B2
(45) Date of Patent: Mar. 7, 2023

(54) MAGNETIC FIELD SENSOR APPARATUS AND METHOD

(71) Applicant: Infineon Technologies AG, Neubiberg (DE)

(72) Inventor: Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/225,863

(22) Filed: Apr. 8, 2021

(65) Prior Publication Data

US 2021/0325481 A1 Oct. 21, 2021

(30) Foreign Application Priority Data

Apr. 20, 2020 (DE) .............................. 102020110682

(51) Int. Cl.
*G01R 33/00* (2006.01)
*G01D 5/20* (2006.01)
*G01D 5/14* (2006.01)
*G01R 33/07* (2006.01)

(52) U.S. Cl.
CPC ......... *G01R 33/0017* (2013.01); *G01D 5/145* (2013.01); *G01D 5/2006* (2013.01); *G01R 33/07* (2013.01)

(58) Field of Classification Search
CPC ... G01R 33/0017; G01D 5/145; G01D 5/2006
See application file for complete search history.

(56) References Cited

U.S. PATENT DOCUMENTS

| 9,217,783 | B2 * | 12/2015 | Kolb ................. G01R 33/0035 |
| 2009/0295380 | A1 * | 12/2009 | Motz ................... G01R 33/072 324/251 |
| 2015/0204951 | A1 * | 7/2015 | Holm .................. G01R 33/098 324/252 |
| 2016/0109608 | A1 | 4/2016 | Branson |
| 2018/0017637 | A1 * | 1/2018 | Cesaretti ............... G01R 33/07 |
| 2018/0172779 | A1 * | 6/2018 | Stahl-Offergeld ... G01R 33/075 |

FOREIGN PATENT DOCUMENTS

WO 2012/001612 A1 1/2012

* cited by examiner

*Primary Examiner* — Alvaro E Fortich
(74) *Attorney, Agent, or Firm* — Harrity & Harrity, LLP

(57) ABSTRACT

Methods and apparatuses are provided, in which a magnetic field is measured using a coil in a first operating mode and a magnetic field is generated using the coil in a second operating mode in order to test a further magnetic field sensor.

21 Claims, 6 Drawing Sheets

MAGNETIC FIELD SENSOR APPARATUS AND METHOD

CROSS REFERENCE TO RELATED APPLICATION

This application claims priority to German Patent Application No. 102020110682.3, filed on Apr. 20, 2020, the contents of which are incorporated by reference herein in their entirety.

TECHNICAL FIELD

The present application relates to magnetic field sensor apparatuses and to corresponding methods.

BACKGROUND

Magnetic field sensor apparatuses are used in different applications to measure magnetic fields. In some applications, the measurement of a magnetic field is used to indirectly measure another variable. One example are motion sensors for capturing a linear movement or a rotational movement. In this case, one or more magnets are fastened, for example, to a movable element, with the result that the movement of the movable object generates a variable magnetic field which is then captured. Another example is the measurement of currents. In this case, a current flow generates a magnetic field which is then measured.

In some applications, a magnetic field may be captured over a wide frequency range. One example is again the measurement of currents if the current is not a direct current, but rather the frequency of the current can vary over a wide range. In these cases, in some implementations, a magnetic field sensor apparatus contains a plurality of magnetic field sensors which operate in different frequency ranges. For example, for high frequencies, a coil can be used as a magnetic field sensor for measuring the magnetic field, whereas, at lower frequencies, a further magnetic field sensor, for example a Hall sensor, is used to measure the magnetic field. Signals from the coil and from the further magnetic field sensor are then combined in order to obtain an output signal.

BRIEF DESCRIPTION

One example implementation provides an apparatus comprising a first coil and a first further magnetic field sensor. The apparatus is configured to measure a magnetic field in a first operating mode using the first coil and to generate a magnetic field for testing the first further magnetic field sensor in a second operating mode using the first coil.

Another example implementation provides a method comprising capturing a magnetic field using a first coil in a first operating mode, and generating a magnetic field for testing a first further magnetic field sensor using the first coil in a second operating mode.

The above summary is merely a brief overview of some example implementations and should not be interpreted as being restrictive.

DETAILED DESCRIPTION

Various example implementations are explained below with reference to the accompanying figures. These example implementations are used merely for explanation and should not be interpreted as being restrictive. Other example implementations may therefore have different features (for example components, elements, method sequences and the like) to the example implementations illustrated.

In addition to the explicitly illustrated features, further features, in particular features used in conventional magnetic field sensor apparatuses, may be provided. Features of different example implementations can be combined with one another unless stated otherwise. Modifications and variations which are described for one of the example implementations can also be applied to other example implementations unless stated otherwise. In addition, for the purpose of the concise description within an example implementation, a multiplicity of features are sometimes described but can also be used independently of one another.

Connections or couplings illustrated in the figures are electrical connections or couplings unless stated otherwise (for example in the case of a coupling via magnetic fields).

Within the scope of the present application, the term "comprise" should be understood in the sense of "contain" or "have" and does not denote any spatial "encompassing".

In the figures, elements which correspond to one another have the same reference signs and are not explained repeatedly.

Figure 1:
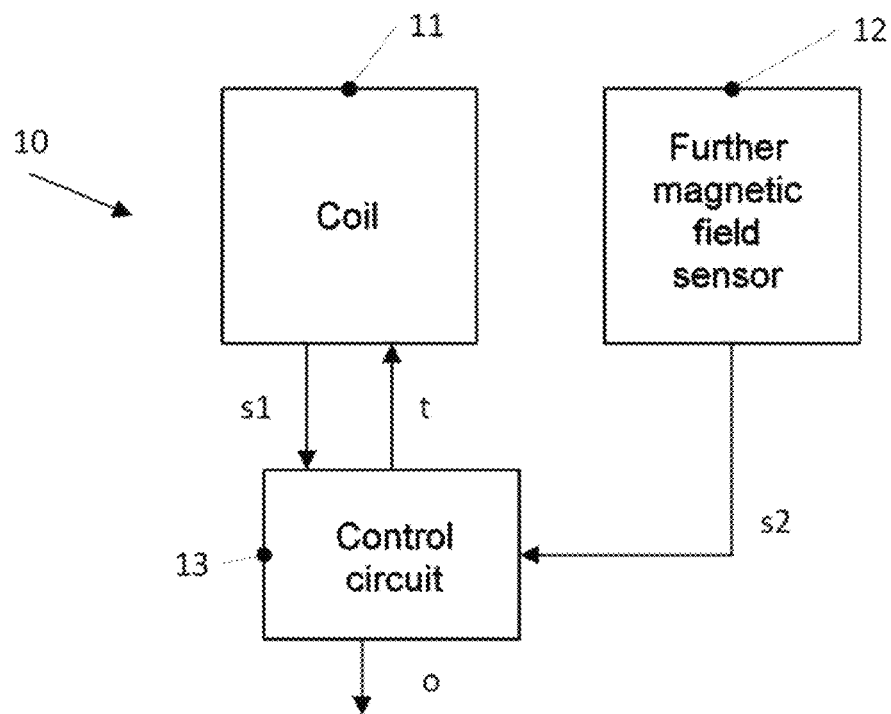
FIG. 1 is a block diagram of an apparatus according to one example implementation.

FIG. 1 shows an apparatus 10 according to one example implementation which can also be referred to as a magnetic field sensor apparatus. The apparatus 10 comprises a coil 11 which, as explained further below, is used in a first operating mode to measure magnetic fields, in particular magnetic fields of high frequencies. The apparatus 10 also comprises a further magnetic field sensor 12 which is used in the first operating mode to measure magnetic fields, in particular at low frequencies. In this case, the terms "high frequencies" and "low frequencies" should be understood relative to one another, that is to say the coil 11 measures magnetic fields at higher frequencies than the further magnetic field sensor 12 in the first operating mode.

In some example implementations, the further magnetic field sensor 12 may be a Hall sensor. In other example implementations, a further magnetic field sensor 12 based on magnetoresistive effects, such as the tunnel magnetoresistance, the giant magnetoresistance, the anisotropic magnetoresistance or the like, can also be used. Such magnetic field sensors are also referred to as XMR sensors. A Hall sensor is used as a further magnetic field sensor in the example implementations described further below, but this should not be interpreted as being restrictive.

The coil 11 and the further magnetic field sensor 12 are connected to a control circuit 13. Whereas the control circuit 13 is illustrated as an individual block, this should be functionally understood, and the control circuit 13 can also be implemented in a manner distributed among a plurality of devices.

In a first operating mode, the apparatus in FIG. 1 is used to measure a magnetic field, in particular an alternating magnetic field over a wide frequency range. As already explained, the coil 11 is used in this case to measure magnetic fields or magnetic field components of higher frequencies, and the further magnetic field sensor 12 is used to measure magnetic fields or magnetic field components of lower frequencies. The lower frequencies may be, for example, in a range of 0 to 10 kHz, for example 1 kHz to 10 kHz, and the higher frequencies may be above 1 kHz, for example up to 100 kHz or above, for example up to 10 MHz. In some applications, the higher frequencies may be in the region of 2 MHz. In response to a captured magnetic field, the coil 11 outputs a signal s1 which is representative of a magnetic field captured by the coil 11, and the further magnetic field sensor 12 outputs a signal s2 which is representative of a magnetic field captured by the further magnetic field sensor 12. The control circuit 13 receives the signals s1, s2 and processes them further. For example, the control circuit 13 may combine the signals s1, s2 to form an output signal o which indicates the entire measured magnetic field.

In a second operating mode, the coil 11 is used to test the further magnetic field sensor 12. The term "test" should be broadly understood here and comprises basic functional tests, calibration operations, settings of gain, for example, voltages and currents, for example for tuning between the further magnetic field sensor 12 and the coil 11, and the like.

In the second operating mode, the control circuit 13 transmits a test signal t to the coil 11. The test signal t can also be externally supplied, for which purpose the control circuit 13 may have, for example, a test pad to which the signal t can be applied. In other example implementations, the signal t is completely or partially generated by the control circuit 13. In this case, "partially" means that an externally applied signal is also modified by the control circuit. The test signal t may be a current which is supplied to the coil.

In a manner corresponding to the test signal t, the coil 11 generates a magnetic field. This magnetic field is captured by the further magnetic field sensor 12 which then supplies a corresponding signal s2 to the control circuit 13. Since the magnetic field generated by the coil 11 is based on the test signal t which is generated for test purposes, parameters of the generated magnetic field, for example a frequency which is based on the frequency of the test signal t, are known. The signal s2 can then be accordingly evaluated and can be used for test purposes. For example, a frequency behavior of the further magnetic field sensor 12 can be determined or tested by varying the frequency of the signal t and therefore of the magnetic field. In the case of a simple test, it is also possible to test whether the further magnetic field sensor 12 fundamentally functions, that is to say, when a magnetic field is generated by the coil 11, supplies a signal s2 which indicates this magnetic field.

On the basis of the test, parameters of the apparatus 10, for example a bias current which will be supplied to the further magnetic field sensor 12 in the case of a Hall sensor, filter coefficients, voltages, gains and the like, can then be adapted. In the apparatus 10, the coil 11 therefore serves two purposes: to measure a magnetic field in the first operating mode, on the one hand, and to generate a magnetic field in the second operating mode, on the other hand. This makes it possible to provide a possible way of testing the further magnetic field sensor 12 with no or only little additional circuit outlay.

The first operating mode can also be referred to as a normal operating mode since the apparatus is used for its ultimate purpose here, specifically the measurement of magnetic fields, while the second operating mode can be referred to as a test operating mode.

Figure 2:
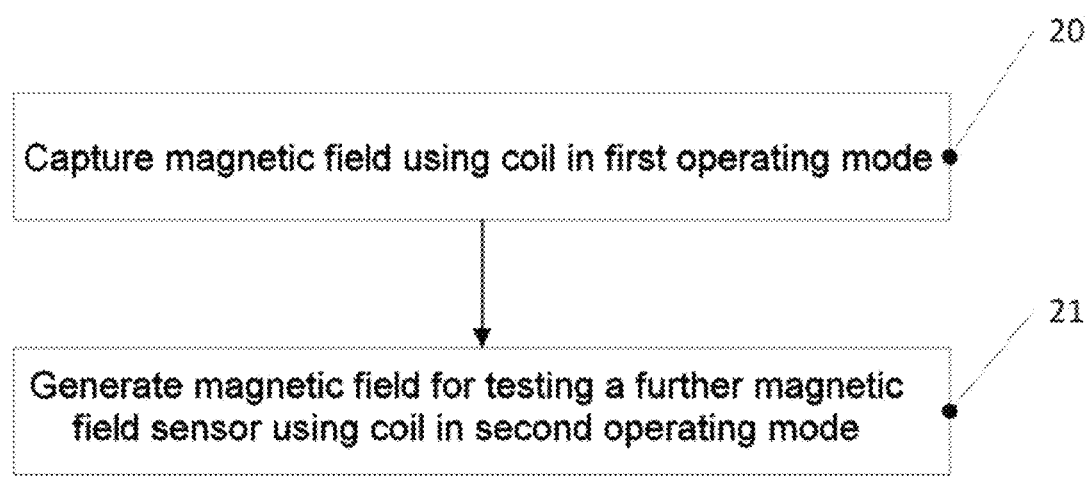
FIG. 2 is a flowchart for illustrating methods according to some example implementations.

FIG. 2 is a flowchart for illustrating methods according to some example implementations. The method in FIG. 2 is described with reference to the apparatus 10 in FIG. 1 in order to avoid repetitions, but can also be implemented with other apparatuses, for example the apparatuses discussed below with reference to FIGS. 4 to 7.

Whereas the method is illustrated as a sequence of events, the events and processes may also be carried out in a different order and/or repeatedly.

At 20, a magnetic field is captured in a first operating mode using a coil, for example the coil 11 in FIG. 1.

At 21, a magnetic field for testing a further magnetic field sensor, for example the further magnetic field sensor 12 in FIG. 2, is generated using the coil in a second operating mode. This testing at 21 can also be carried out, for example, before first capturing the magnetic field using the coil at 20 in order to calibrate an apparatus which is used before measuring magnetic fields.

The second operating mode can be adopted repeatedly, for example at regular or irregular intervals of time, or when starting up a system which comprises the coil, for example. This makes it possible to compensate for ageing effects or drift effects.

Figure 3:
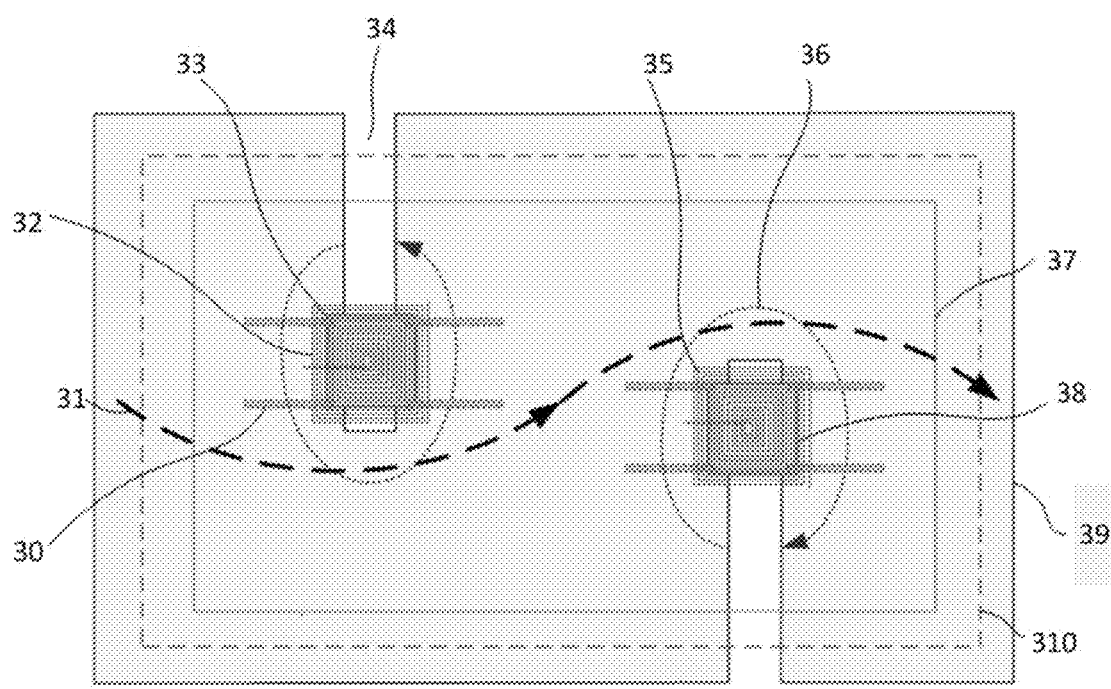
FIG. 3 is an example configuration of coils and Hall sensors according to some example implementations.

FIG. 3 shows a possible arrangement of coils and further magnetic field sensors, Hall sensors in this case, in a magnetic field sensor apparatus, as can be used in various example implementations.

In the magnetic field sensor apparatus in FIG. 3, a chip 37 is fitted to a leadframe 39 via one or more insulation or adhesive layers 310. A current 31 which is indicated by a dashed line is intended to be measured using a magnetic field sensor apparatus. The magnetic field sensor apparatus comprises a first coil 32, a first Hall plate 33, a second coil 35 and a second Hall plate 38. The first coil 32 and the first Hall plate 33 are used to measure a magnetic field which is generated by the current 31 at a first location, and the second coil 35 and the second Hall plate 38 are used to measure the magnetic field generated by the current 31 at a second location. The illustrated arrangement, in which the magnetic field runs in a different direction at the first location and at the second location, makes it possible to achieve offset compensation by combining the measurements at the first location and the second location. Slots 34 in the leadframe 39 are used in this case to suppress eddy currents, as are indicated by arrows 36. Connections of the Hall plates are denoted using 30.

This magnetic field measurement can be carried out in a first operating mode, as explained above with reference to FIGS. 1 and 2. In a second operating mode, the first coil 32 can be used to generate a magnetic field for testing the first Hall plate 33, and/or the second coil 35 can be used to generate a magnetic field for testing the second Hall plate 38. In addition, as will be explained in yet more detail later, if a magnetic field for testing the first Hall plate 33 is generated using the first coil 32, the second coil 35 can be used, for example, in the second operating mode as a resistor in a voltage source, on the basis of which a test signal is generated, which test signal is supplied to the first coil 32 (for example the test signal t). In addition to measuring a magnetic field and generating a magnetic field, a coil can therefore also be used for a third purpose, specifically as a reference resistor. Such a use as a reference resistor is now explained with reference to FIG. 4.

Figure 4:
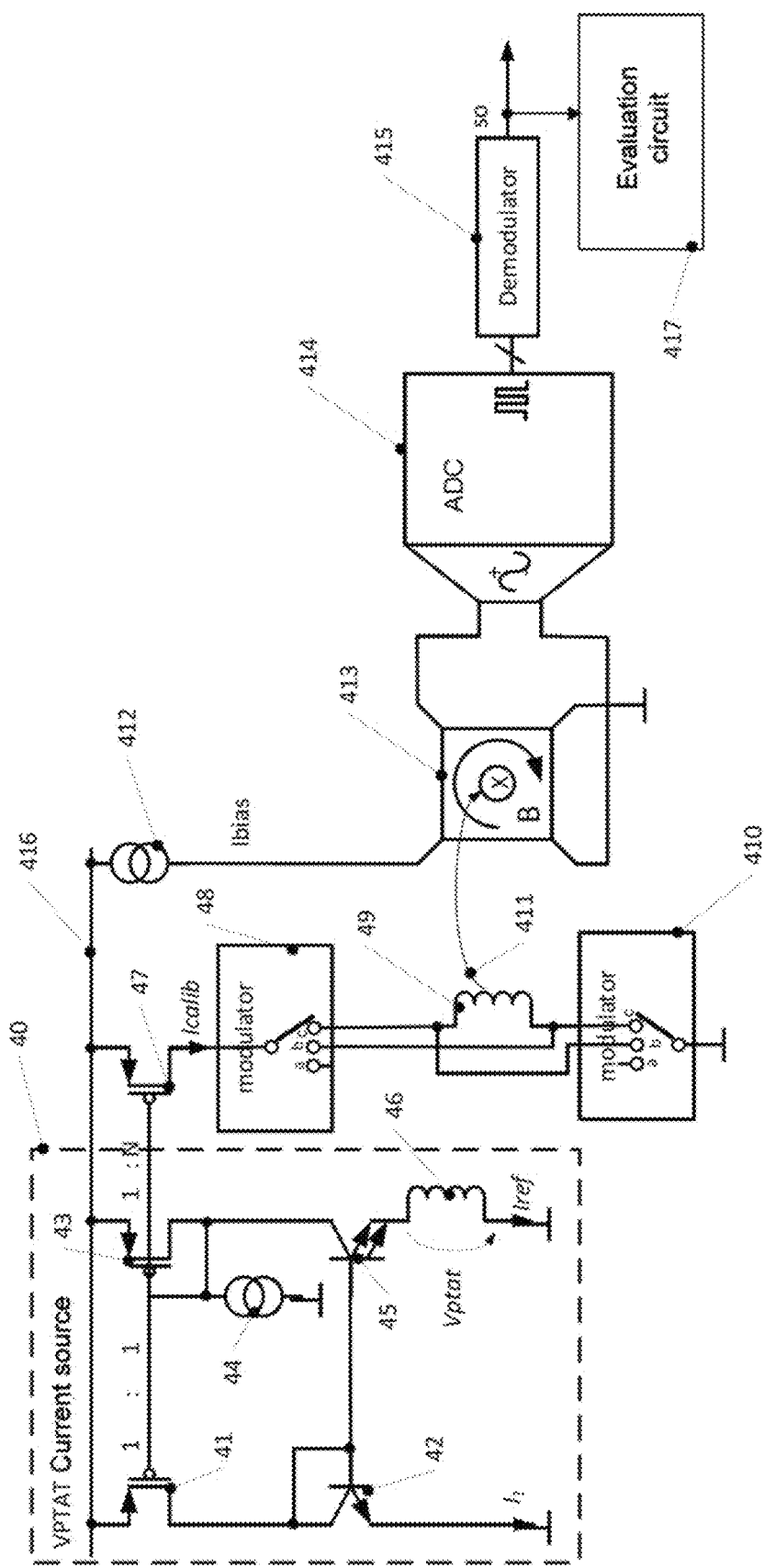
FIGS. 4 to 6 are circuit diagrams of apparatuses according to some example implementations.

FIG. 4 shows an apparatus according to a further example implementation. The example implementation uses a first coil 49 and a Hall sensor 413 to measure a magnetic field in a first operating mode and uses the first coil 49 to generate a magnetic field for testing the Hall sensor 413 in a second operating mode.

In the second operating mode, a second coil 46 is also used as a reference resistor for generating a current which is supplied to the first coil 49 as a test signal in the second operating mode. If the second coil on the chip is used as a reference resistor, this can reduce dependencies on mechanical stresses. In the first operating mode, this second coil 46 can likewise measure the magnetic field together with a further Hall sensor, as explained for the coils 32, 35 and the Hall plates 33, 38 with reference to FIG. 3. In such an implementation, switches (not illustrated in FIG. 4 for reasons of clarity) can also make it possible to swap the roles of the first coil 49 and the second coil 46, with the result that the first coil 49 can also be used as a reference resistor and the second coil 46 can be used to generate a magnetic field—then for testing the further Hall sensor—in the second operating mode.

The method of operation of the example implementation in FIG. 4 is described in more detail below.

A VPTAT (voltage proportional to absolute temperature) current source 40 is used to generate a current Icalib which is used in the second operating mode. This current source is based on a bandgap reference circuit.

The current source 40 comprises a transistor 42 and a transistor 45 which are connected as illustrated and have an area ratio of 1:M, for example of 1 to 8. The transistor 45 is coupled to ground via the second coil 46. A voltage which is dropped across the second coil 46 is denoted using Vptat. Furthermore, transistors 41, 43 which are connected as a current mirror and have an area ratio of 1:1 are connected in series with the transistors 42, 45. This means that a current Ii is equal to a current Iref. The current Iref may be in a range of 2 µA to 200 µA, for example. In one implementation example, the current Iref may be 54 µm. In addition, a CTAT (complementary to absolute temperature) current is optionally supplied from a current source 44, the function of which is explained further below. The reference sign 416 indicates a positive supply voltage. The method of operation of the VPTAT current source 40 is explained below on the basis of a numerical example.

The voltage Vptat is:

$$Vptat = \ln\frac{A_M I_{ref}}{A_1 I_1}\frac{kT}{q}$$

In this case, $A_M/A_1$ is the area ratio of the transistor 45 to the transistor 42 and is assumed to be 8:1 in this numerical example. k is the Boltzmann constant, T is the absolute temperature and q is the elementary charge. The above numerical example results in a voltage of 54 mV at 27° C. According to the above formula, the temperature coefficient of the voltage VPTAT is 1/300/K or +3333 ppm/K at 27° C. corresponding to 300 K (ppm=parts per million).

The resistance of the second coil, which is produced from aluminum in the example, may be written as $R_{metal}=R_0(1+\alpha(T-T_0))$. In a typical coil, $R_0$ may be 1 kΩ, for example, and α=+3300 ppm/K.

Figure 8:
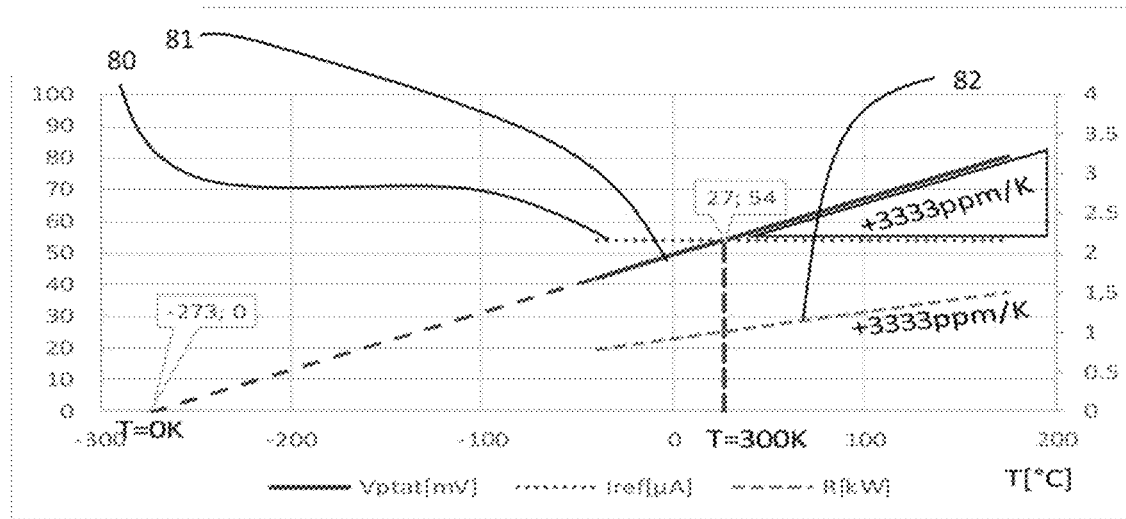
FIG. 8 shows an example of a temperature behavior, as is used in some example implementations.

Iref=VPTAT/$R_{metal}$. Therefore, the temperature coefficients of VPTAT and $R_{metal}$ substantially cancel each other out around 27° C., that is to say in the region of the room temperature, with the result that the temperature dependence of Iref is only in the range of 0 to 33 ppm/K. The temperature dependence of the coupling between the first coil 49 and the Hall sensor 413 is 0 ppm/K. This means that the magnetic field B which is measured by the Hall sensor 413 in the second operating mode substantially has no temperature dependence. In order to explain this circumstance, a curve 81 in FIG. 8 shows a typical temperature dependence for VPTAT in mV and a curve 82 shows a typical temperature dependence for the coil resistance $R_{metal}$ in kΩ, both with a gradient of +3333 ppm/K. As shown by a curve 80, this results in a substantially temperature-independent reference current Iref around room temperature (T=300 K).

In some example implementations, the optional current source 44 makes it possible to further reduce any remaining temperature dependence. For this purpose, the optional current source 44 may have a temperature coefficient which differs from the temperature dependence of $R_{metal}$ and Vptat, for example −2800 ppm/K in the above numerical example. The current source 44 may be implemented using polysilicon resistors, for example. In this case, the contribution of the current source 44 may be comparatively low, for example less than 10% or less than 5% of the current Iref. As a result of such a low contribution, even in the case of relatively large technology fluctuations (for example 20%) or in the case of a relatively large dependence on mechanical stresses (for example 4% per GPa), a fault which is produced by such fluctuations may be low (for example less than 1%).

The substantially temperature-stable reference current Iref generated in this manner is mirrored to the current Icalib via a current mirror between the transistor 43 and a transistor 47. An area ratio of the transistors 43 and 47 may be 1:N, for example 1 to 100, with the result that the current Icalib is N times greater than the current Iref. In the above numerical example with Iref=54 µA and N=100, Icalib may then be 5.4 mA. The current Icalib is supplied to the first coil 49 in the second operating mode via a modulator arrangement having modulators 48, 410. The modulators 48, 410 are each illustrated with a triple switch which can assume three different positions a, b and c. These switches should be understood as being symbolic of the functionality of supplying the current Icalib in the manner described below, and this can also be achieved using other implementations, for example using a plurality of switches connected in series. Such switches may be implemented as transistors, for example.

In the first operating mode in which the first coil is used to measure magnetic fields, the switches of the modulators 48, 410 are each in the position a, with the result that the current Icalib is not supplied to the first coil 49. In the second operating mode, the switches of the modulators 48, 410 can change between the positions b and c. If the switches are in the position b, the current Icalib is supplied to the first coil 49 with a first polarity. If the switches are in the position c, the current Icalib is supplied to the first coil 49 with a second polarity opposite the first polarity. An alternating field at the corresponding frequency can therefore be generated by the first coil 49 by changing between the positions b and c at an adjustable frequency.

As indicated by an arrow 411, the magnetic field generated in this manner is then measured by the Hall sensor 413.

The Hall sensor 413 is supplied with a bias current by a current source 412. As indicated by an arrow, the magnetic field sensor 413 is operated using a so-called spinning current technique. In this case, the connections of the Hall sensor 413, via which the bias current flows, and connections of the Hall sensor 413, at which a Hall voltage is tapped off, are cyclically exchanged. This makes it possible to compensate for an offset of the Hall sensor 413. In the example implementation in FIG. 4, the Hall voltage is supplied to an analog/digital converter 414. Other components may be additionally or alternatively provided, for example amplifiers or comparators. The signal output by the analog/digital converter 414 is supplied to a demodulator 415 which demodulates the signal according to the spinning current technique in order to generate an output signal. In the first operating mode, the signal is then used by further circuit parts. If the apparatus in FIG. 4 is used, for example, to measure a current, as in FIG. 3, the signal therefore indicates the magnitude of the measured current and can then be accordingly used further. In some example implementations, the use of the spinning current technique allows small zero point errors in the magnetic field measurement at low magnetic field frequencies or in the case of constant magnetic fields.

In the second operating mode, the signal is evaluated in an evaluation circuit 417 in order to then set a digital correction, for example, to set filters for tuning the Hall sensor 413 to the first coil 419, or to set a sensitivity of the Hall sensor 413, for example by setting the bias current from the current source 412.

In the example implementation in FIG. 4, the second coil is used as a reference resistor for generating the current Iref and therefore the current Icalib. The second coil 46 may also be used as a reference resistor for generating the bias current Ibias, as a reference resistor for the analog/digital converter 414 or as a reference resistor for a gain of an amplifier. In other example implementations, the second coil 46 is not used, and it is possible to use another type of reference resistor, for example a metal resistor, a silicided or metallized polysilicon resistor, a diffusion resistor or an implementation resistor or another resistor, which is formed on the chip and has a similar temperature coefficient to the coil 46 (approximately 3333 ppm/K in the above example), for example with a deviation of less than 300 ppm/K, and a low dependence on mechanical stresses, for example less than 4%/GPa. Such a low dependence can be achieved, for example, by formation directly on the chip. Another reference resistor of this type can also be used for the other applications mentioned above, for example for generating the bias current Ibias, as a reference resistor for the analog/digital converter 414 or as a reference resistor for a gain of an amplifier. In addition, in this case, it is possible to provide conventional compensation for mechanical stresses, in which the mechanical stresses are measured. Such compensation may be analog or digital. An analog correction can be carried out, for example, by changing a gain factor (for example a resistor in a feedback path of an operational amplifier). A digital correction can be effected using digital actuators which influence the sensitivity of the signal path, for example using digitally adjustable bias current sources of a Hall sensor digitally adjustable taps of a gain-determining resistor of an operational amplifier.

In contrast, such compensation for mechanical stresses may not be required when using the second coil 46.

Figure 5:
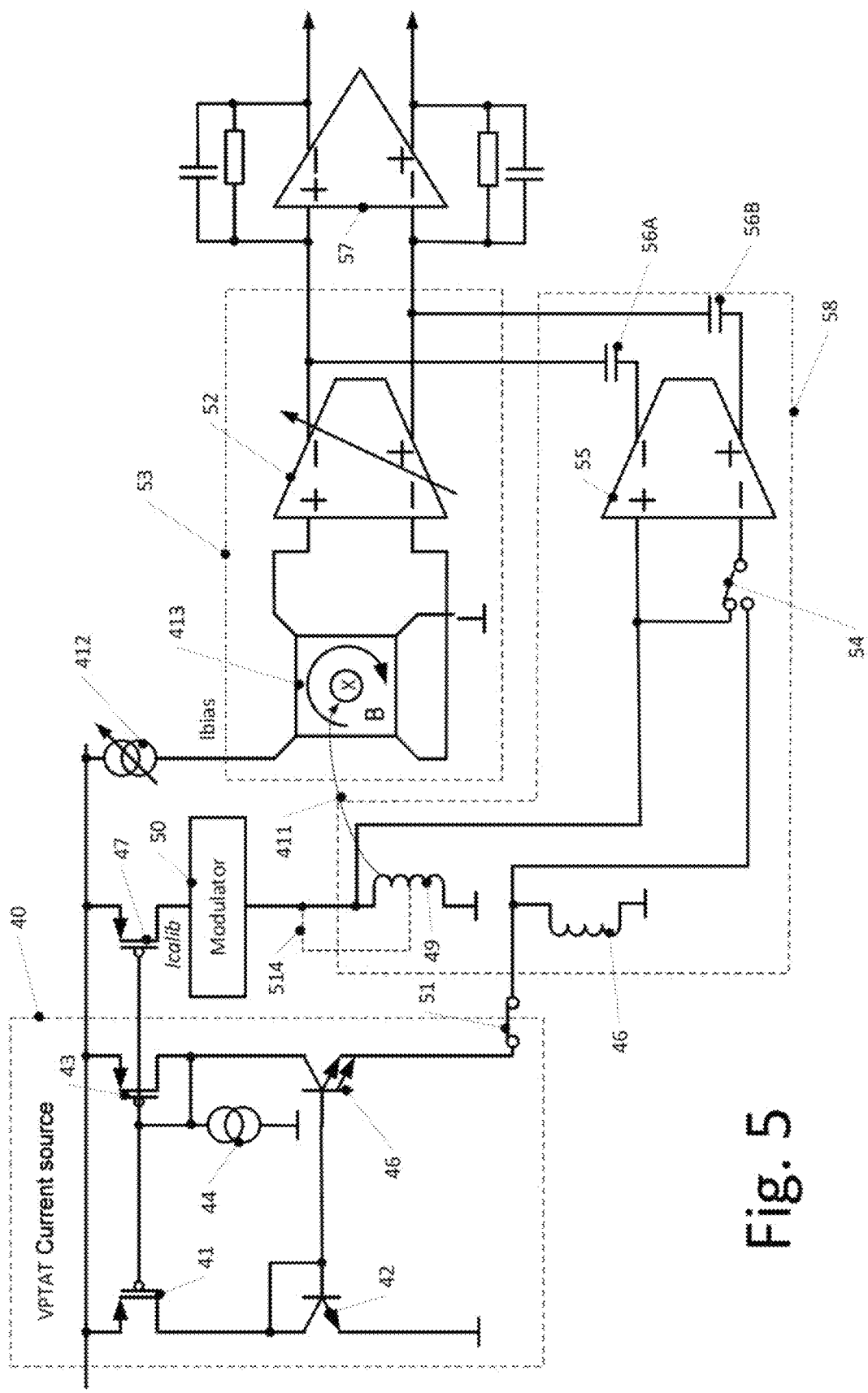

FIG. 5 shows an apparatus according to a further example implementation which shows a modification of the example implementation in FIG. 4 and shows examples of how signal paths can be implemented in the first operating mode and how it is possible to change over between the first operating mode and the second operating mode. Unless explained otherwise, elements which correspond to one another have the same reference signs and operate in the manner already explained with reference to FIG. 4.

Like the apparatus in FIG. 4, the apparatus in FIG. 5 also has the first coil 49, the second coil 46 and the magnetic field sensor 413. The first coil 49 and the second coil 46 may be arranged in the manner illustrated in FIG. 3 in order to differentially measure a current. The magnetic field sensor 413 may be arranged in the first coil 49. A further magnetic field sensor (not shown in FIG. 5) may be arranged in the second coil 46 and may be connected to the magnetic field sensor 413 to form a differential measurement arrangement, as will be explained later with reference to FIG. 6. A first switch 51 and a second switch 54 are used to change over between the operating modes. In the first operating mode in which a magnetic field is measured, the first switch 51 is open and the second switch 54 connects the second coil 56 to a negative input of a transconductance amplifier (OTA, operational transconductance amplifier) 55. A positive input of the transconductance amplifier 55 is connected to the first coil 49. A modulator arrangement 50 is also provided and can operate in the manner described for the modulator 48, 410 in FIG. 4 and does not supply the current Icalib to the first coil 49 in the first operating mode according to the switch position "a" in FIG. 4.

Outputs of the transconductance amplifier 55 are supplied, via capacitances 56A, 56B, to inputs of an operational amplifier (OPA) 57 which is connected in a feedback path with capacitors and resistors, as illustrated. In this case, the capacitances 56A, 56B are used as high-pass filters, with the result that the coils 49, 46 provide a high-frequency component.

In addition, in the first operating mode, the bias current Ibias is supplied to the Hall sensor 413. A Hall voltage of the Hall sensor 413 is amplified using an adjustable transconductance amplifier 52, the outputs from which are likewise supplied to the operational amplifier 57, with the result that the result of the magnetic field measurement by the Hall sensor 413 is combined here with the result of the magnetic field measurement by the coils 49, 46. As already explained, a further Hall sensor 413 may also be provided for differential measurement, as shown in FIG. 3 and as described further below with reference to FIG. 6. In the first operating mode, the coils 49, 46 therefore form a high-frequency path 58, and the Hall sensor 413 is part of a low-frequency path 53.

The operational amplifier 57 can then be followed, for example, by an analog/digital converter and a demodulator such as the analog/digital converter 414 and the demodulator 415 in FIG. 4.

The second operating mode in FIG. 5 is described next.

The switch 51 is closed in the second operating mode. In addition, the second switch 54 connects the first coil 49 to the negative input of the transconductance amplifier 55, with the result that the same signal is present at the positive and negative inputs. With this configuration, the second coil 46 is used as a reference resistor for the VPTAT current source 40, as already explained with reference to FIG. 4. The current Icalib is thus generated and is supplied, in the second operating mode, for example as described in FIG. 4, to the first coil 49 via the modulator arrangement 50, with the result that the first coil generates a magnetic field which is then measured by the magnetic field sensor 413. An output signal from the apparatus can then be evaluated by an evaluation circuit such as the evaluation circuit 417. The current source 412 or the transconductance amplifier 52 can be adjusted, for example, on the basis of this evaluation.

It should be noted that the entire first coil 49 does not need to be used in both operating modes. For example, in some example implementations, the entire first coil 49 can be used in the first operating mode, whereas only a part of the first coil 49 is used to generate the magnetic field in the second operating mode, as indicated by a dashed line 514. The first coil 49 may have a center tap, for example, for this purpose. In the case of the second coil 46 as well, only a part can be used as a reference resistor in the second operating mode, for example. This modification can be applied to all example implementations presented here.

In the example implementations in FIGS. 4 and 5, the current Icalib is respectively supplied to the first coil 49 for test purposes and is modulated by a modulator arrangement. In other example implementations, a test current can be externally supplied to the first coil via a pad. Such a pad can then be used for other purposes in the circuit in the first operating mode. Such an example implementation of an apparatus is illustrated in FIG. 6.

Figure 6:
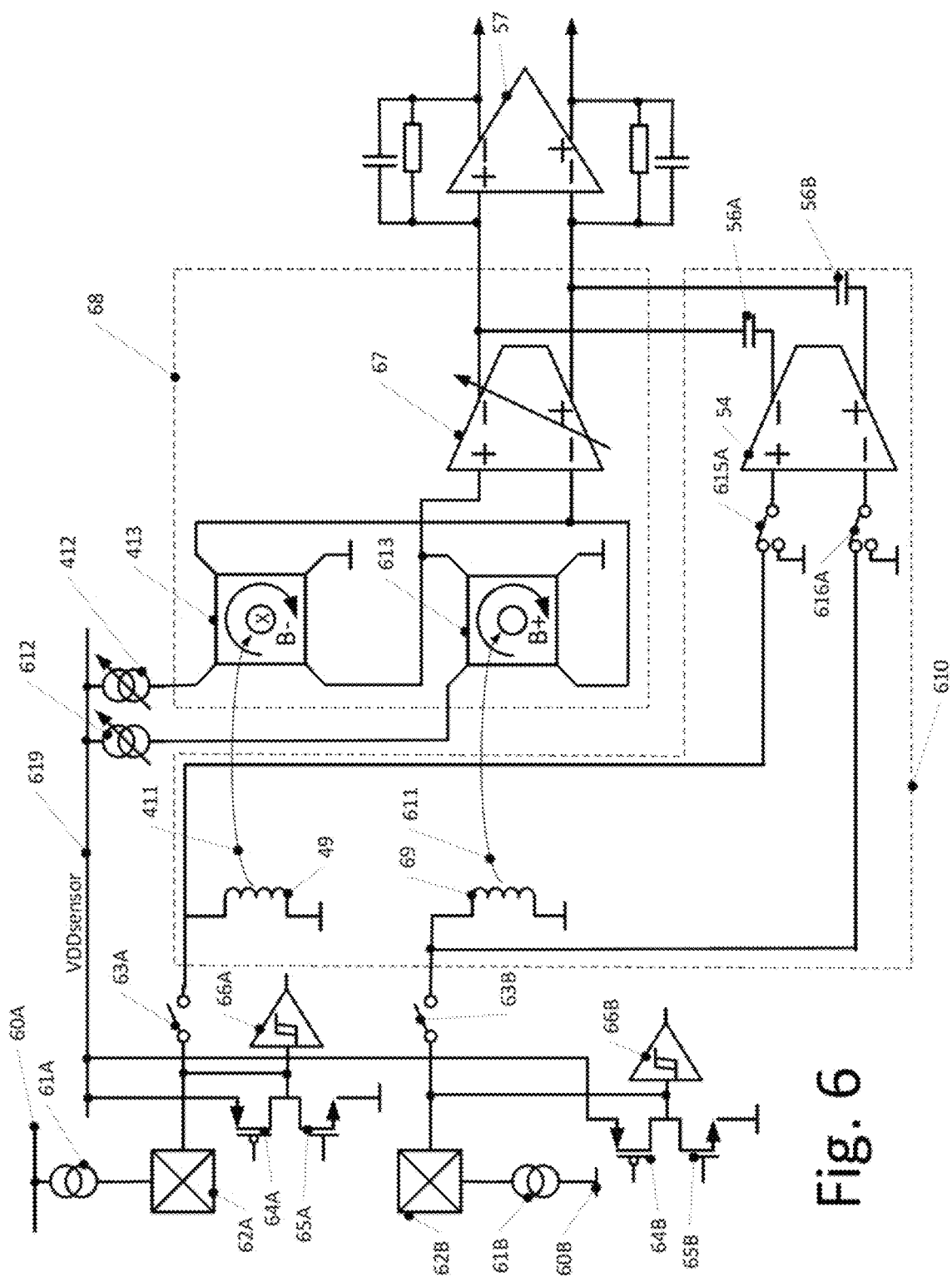

The example implementation in FIG. 6 has a first coil 49 and a second coil 69 which can correspond to the coils in FIG. 3. The Hall sensor 413 which has already been discussed and is also referred to as a first Hall sensor 413 here is assigned to the first coil 49, and a second Hall sensor 613 is assigned to the second coil 69. The Hall sensors 413, 613 may be the corresponding Hall plates in FIG. 3.

The apparatus in FIG. 6 is supplied with energy via a positive supply voltage VDDsensor at 619.

Switches 63A, 63B are open in the first operating mode. A switch 615A connects the first coil 49 to a positive input of a transconductance amplifier 52, and a switch 616A connects the second coil 69 to a negative input of the transconductance amplifier 52. Outputs of the transconductance amplifier 52 are connected, via the capacitors 56A, 56B which have already been described, to the operational amplifier 57 which has likewise already been described with reference to FIG. 5.

In the first operating mode, the coils 49, 69 are therefore part of a high-frequency path 610 which operates substantially like the high-frequency path 58 in FIG. 5.

In addition, in the first operating mode, the Hall sensor 413 is supplied by the current source 412 with the bias current which has already been described, and the second Hall sensor 613 is accordingly supplied with a bias current by a current source 612. In some example implementations, the Hall sensors 413, 613 are operated using a spinning current technique. The Hall voltages of the Hall sensors 413, 613 are supplied together, as illustrated, to a transconductance amplifier 67 which corresponds, in terms of its function, to the transconductance amplifier 52 in FIG. 5, but here receives signals from both Hall sensors 413, 613. As already explained in the description of FIG. 5, two Hall sensors may also be provided in FIG. 5 and can then be connected as shown in FIG. 6. Outputs of the transconductance amplifier 67 are connected to inputs of the operational amplifier 57. The Hall sensors 413, 613 and the transconductance amplifier 67 therefore form a low-frequency pad 68.

The apparatus in FIG. 6 also has pads 62A, 62B. These pads can be used as input pads and/or output pads (I/O pads) in the first operating mode. For example, signals from a push-pull output interface having transistors 64A, 65A can be tapped off at the pad 62A, or signals from a push-pull output interface 64B, 65B can be tapped off at the pad 62B and signals can therefore be output from the apparatus. Conversely, signals can be supplied to the apparatus via the pad 62A via an input interface 66A in the form of a Schmitt trigger, or signals can be supplied via the pad 62B via an interface 66B. These output signals and input signals may be any signals used within the apparatus and are only an example of the use of the pads 62A, 62B in the first operating mode.

As already described, an output signal from the operational amplifier 57 can then be processed further in the first operating mode. In the case of a current measurement as in FIG. 3, this output signal is indicative of the measured current and open-loop control or closed-loop control can then take place on the basis of this signal, for example.

The switches 63A, 63B are closed in the second operating mode. In addition, the inputs of the transconductance amplifier 84 are disconnected from the coils 49, 69 and are connected to ground, with the result that the same signal (ground in this case) is present at the inputs of the transconductance amplifier 54 and the output signal is 0.

A test current from a current source 61A, which is supplied by a voltage 60A, can then be supplied to the first coil 49 via the pad 82A in order to generate a magnetic field for testing the Hall sensor 413, as indicated by an arrow 411. In a corresponding manner, a test current can be supplied to the second coil 69 via the pad 62B from a current source 61B, which is supplied by a supply voltage 60B (which may be the same as the supply voltage 60A), in order to thus generate a magnetic field for testing the second Hall sensor 613, as indicated by an arrow 611. As already explained with reference to previous figures, this testing can then be carried out in order to adjust the apparatus, for example in order to adjust the current sources 412, 612 for generating the bias currents, or by adjusting the transconductance amplifier 67.

In the example implementation in FIG. 6, there is no need to provide an additional pad for externally supplying a test current, but rather pads which can be used to input or output signals in the first operating mode (I/O pads) can be used. However, separate pads may also be provided in other example implementations.

Figure 7:
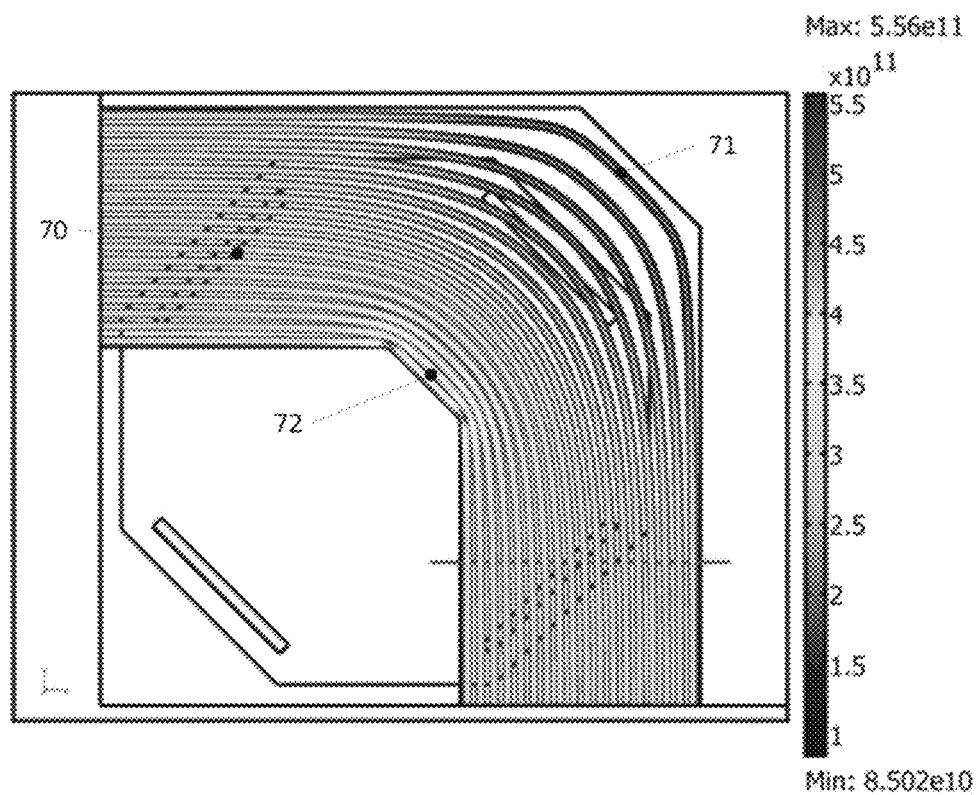
FIG. 7 is an illustration of part of a coil, as can be used in some example implementations.

FIG. 7 shows an example of a coil layout having conductor tracks on a chip, as can be used in various example implementations, for example the example implementations described above, as a first coil and/or as a second coil. In this case, FIG. 7 shows a quarter of a coil 70. Windings of the coil are relatively close together in an inner region 72, whereas they are spaced apart in an outer region 71. Other coil layouts can also be used. As already explained with reference to FIG. 5, only a part of the coil may be used in the first operating mode or the second operating mode, for example using an additional tap. Coils such as the coil in FIG. 7 may be implemented in a single metal layer, but may also be implemented in a plurality of metal layers which are above one another and are separated by a dielectric above a substrate, for example a semiconductor substrate.

EXAMPLES

Some example implementations are defined by the following examples:

Example 1. Apparatus comprising:
a first coil and
a first further magnetic field sensor,
wherein the apparatus is configured to measure a magnetic field in a first operating mode using the first coil and to generate a magnetic field for testing the first further magnetic field sensor in a second operating mode using the first coil.

Example 2. Apparatus according to example 1, wherein the apparatus is configured to measure magnetic fields at higher frequencies using the first coil and to measure magnetic fields at lower frequencies using the first further magnetic field sensor in the first operating mode.

Example 3. Apparatus according to example 1 or 2, wherein the first further magnetic field sensor is a Hall sensor.

Example 4. Apparatus according to example 3, wherein the apparatus is configured to operate the Hall sensor using a spinning current technique.

Example 5. Apparatus according to one of examples 1 to 4, also comprising an evaluation circuit for evaluating a signal generated by the first further magnetic field sensor in response to the generation of the magnetic field in the second operating mode.

Example 6. Apparatus according to example 5, wherein the evaluation circuit is configured to set a bias current for the first further magnetic field sensor and/or an amplifier coupled to an output of the first further magnetic field sensor on the basis of the generated signal.

Example 7. Apparatus according to one of examples 1 to 6, also comprising a second coil, wherein the apparatus is configured to measure a magnetic field in the first operating mode using the second coil.

Example 8. Apparatus according to example 7, also comprising a second further magnetic field sensor.

Example 9. Apparatus according to example 8, wherein the first further magnetic field sensor and the second further magnetic field sensor are connected for the purpose of differentially measuring a magnetic field in the first operating mode.

Example 10. Apparatus according to example 8 or 9, wherein the apparatus is configured to generate a further magnetic field for testing the second further magnetic field sensor in the second operating mode using the second coil.

Example 11. Apparatus according to one of examples 1 to 10, wherein the first coil and/or the second coil can be connected to a pad in the second operating mode in order to receive a test current or a further test current for generating the magnetic field or the further magnetic field via the pad, and wherein the pad is used as an input connection and/or output connection in the first operating mode.

Example 12. Apparatus according to one of examples 7 to 10, wherein the apparatus is configured to use the second coil as a reference resistor in the second operating mode.

Example 13. Apparatus according to example 12, wherein the reference resistor is a reference resistor of a current source circuit for generating a reference current, on which a test current, which can be supplied to the first coil for generating the magnetic field in the second operating mode, is based.

Example 14. Apparatus according to one of examples 1 to 13, wherein the apparatus comprises a silicided or metallized polysilicon resistor, diffusion resistor or implantation resistor as a reference resistor of a current source circuit for generating a reference current, on which a test current, which can be supplied to the first coil for generating the magnetic field in the second operating mode, is based, for generating a bias current for the first further magnetic field sensor, as a reference resistor for an analog/digital converter or as a reference resistor for a gain of an amplifier.

Example 15. Apparatus according to one of examples 1 to 14, wherein the apparatus is configured to use only a part of the first coil in the first operating mode or in the second operating mode.

Example 16. Method comprising:
capturing a magnetic field using a first coil in a first operating mode, and
generating a magnetic field for testing a first further magnetic field sensor using the first coil in a second operating mode.

Example 17. Method according to example 16, wherein magnetic fields at higher frequencies are captured using the first coil and magnetic fields at lower frequencies are captured using the first further magnetic field sensor in the first operating mode.

Example 18. Method according to example 16 or 17, wherein the first further magnetic field sensor is a Hall sensor.

Example 19. Method according to example 18, wherein the Hall sensor is operated using a spinning current technique.

Example 20. Method according to one of examples 16 to 19, also comprising evaluating a signal generated by the first further magnetic field sensor in response to the generation of the magnetic field in the second operating mode.

Example 21. Method according to example 20, also comprising setting a bias current for the first further magnetic field sensor and/or an amplifier coupled to an output of the first further magnetic field sensor on the basis of the generated signal.

Example 22. Method according to one of examples 16 to 21, also comprising measuring a magnetic field using a second coil in the first operating mode.

Example 23. Method according to example 22, also comprising generating a further magnetic field for testing a second further magnetic field sensor using the second coil in the second operating mode.

Example 24. Method according to example 22 or 23, also comprising using the second coil in the second operating mode as a reference resistor.

Example 25. Method according to example 24, wherein the reference resistor is a reference resistor of a current source circuit for generating a reference current, on which the test current is based.

Example 26. Method according to one of examples 16 to 25, wherein the method comprises using a silicided or metallized polysilicon resistor, diffusion resistor or implantation resistor as a reference resistor of a current source circuit for generating a reference current, on which a test current, which can be supplied to the first coil for generating the magnetic field in the second operating mode, is based, for generating a bias current for the first further magnetic field sensor, as a reference resistor for an analog/digital converter or as a reference resistor for a gain of an amplifier.

Example 27. Method according to one of examples 16 to 26, also comprising connecting the first coil and/or the second coil to a pad in the second operating mode, and receiving a test current or a further test current via the pad, and using the pad as an input connection and/or output connection in the first operating mode.

Example 28. Method according to one of examples 16 to 27, wherein only a part of the first coil is used in the first operating mode or in the second operating mode.

Although specific example implementations have been illustrated and described in this description, persons with conventional expert knowledge will recognize that a multiplicity of alternative and/or equivalent implementations can be selected as a replacement for the specific example implementations which are shown and described in this description without departing from the scope of the implementation shown. The intention is for this application to cover all adaptations or variations of the specific example implementations which are discussed here. Therefore, the intention is for this implementation to be limited only by the claims and the equivalents of the claims.

The invention claimed is:

1. An apparatus comprising:
   a first coil; and
   a first further magnetic field sensor,
   wherein the apparatus is configured to measure a magnetic field in a first operating mode using the first coil and to generate a magnetic field for testing the first further magnetic field sensor in a second operating mode using the first coil,
   wherein a current is supplied to the first coil in the second operating mode to generate the magnetic field for testing the further magnetic field sensor, and
   wherein the current is not supplied to the first coil in the first operating mode for measuring the magnetic field.

2. The apparatus as claimed in claim 1, further comprising:
   an evaluation circuit for evaluating a signal generated by the first further magnetic field sensor in response to generation of the magnetic field in the second operating mode.

3. The apparatus as claimed in claim 2, wherein the evaluation circuit is configured to set a bias current for at least one of the first further magnetic field sensor or an amplifier coupled to an output of the first further magnetic field sensor based on the signal.

4. The apparatus as claimed in claim 1, further comprising:
   a second coil, wherein the apparatus is configured to measure a magnetic field in the first operating mode using the second coil.

5. The apparatus as claimed in claim 4, further comprising:
   a second further magnetic field sensor.

6. The apparatus as claimed in claim 5, wherein the apparatus is configured to generate a further magnetic field for testing the second further magnetic field sensor in the second operating mode using the second coil.

7. The apparatus as claimed in claim 6, wherein at least one of the first coil or the second coil are connectable to a pad in the second operating mode in order to receive a test current or a further test current for generating the magnetic field or the further magnetic field via the pad, and wherein the pad is used as at least one of an input connection or output connection in the first operating mode.

8. The apparatus as claimed in claim 4, wherein the apparatus is configured to use the second coil as a reference resistor in the second operating mode,
   wherein using the second coil as the reference resistor comprises using a resistance based on a material of the second coil.

9. The apparatus as claimed in claim 8, wherein the reference resistor is a reference resistor of a current source circuit for generating a reference current, on which a test current, which is supplied to the first coil for generating the magnetic field in the second operating mode, is based.

10. The apparatus as claimed in claim 1, further comprising:
    a silicided or metallized polysilicon resistor, diffusion resistor or implantation resistor as a reference resistor of a current source circuit for generating a reference current, on which a test current, which is supplied to the first coil for generating the magnetic field in the second operating mode, is based, for generating a bias current for the first further magnetic field sensor, as a first reference resistor for an analog/digital converter or as a second reference resistor for a gain of an amplifier.

11. The apparatus as claimed in claim 1, wherein the apparatus is configured to use only a part of the first coil in the first operating mode or in the second operating mode.

12. A method comprising:
    capturing a magnetic field using a first coil in a first operating mode,
       wherein a current is not supplied to the first coil in the first operating mode for measuring the magnetic field, and
    generating a magnetic field for testing a first further magnetic field sensor using the first coil in a second operating mode,
       wherein a current is supplied to the first coil in the second operating mode to generate the magnetic field for testing the further magnetic field sensor.

13. The method as claimed in claim 12, further comprising:
    evaluating a signal generated by the first further magnetic field sensor in response to the generation of the magnetic field in the second operating mode.

14. The method as claimed in claim 13, further comprising:
    setting a bias current for at least one of the first further magnetic field sensor or an amplifier coupled to an output of the first further magnetic field sensor based on the signal.

15. The method as claimed in claim 12, further comprising:
    measuring a magnetic field using a second coil in the first operating mode.

16. The method as claimed in claim 15, further comprising:
    generating a further magnetic field for testing a second further magnetic field sensor using the second coil in the second operating mode.

17. The method as claimed in claim 15, further comprising:
    using the second coil in the second operating mode as a reference resistor,
       wherein using the second coil as the reference resistor comprises using a resistance based on a material of the second coil.

18. The method as claimed in claim 17, wherein the reference resistor is a reference resistor of a current source circuit for generating a reference current, on which the test current is based.

19. The method as claimed in claim 12, further comprising:
    using a silicided or metallized polysilicon resistor, diffusion resistor or implantation resistor as a reference resistor of a current source circuit for generating a reference current, on which a test current, which can be supplied to the first coil for generating the magnetic field in the second operating mode, is based, for generating a bias current for the first further magnetic field sensor, as a first reference resistor for an analog/digital converter or as a second reference resistor for a gain of an amplifier.

20. The method as claimed in claim 12, further comprising:
    connecting the first coil and/or a second coil to a pad in the second operating mode, and receiving a test current or a further test current via the pad, and using the pad as at least one of an input connection or output connection in the first operating mode.

21. The method as claimed in claim 12, wherein only a part of the first coil is used in the first operating mode or in the second operating mode.

\* \* \* \* \*